US012782810B2

(12) United States Patent
Qian

(10) Patent No.: US 12,782,810 B2
(45) Date of Patent: Nov. 3, 2026

(54) EO/PO-MODIFIED 9-PHENYLACRIDINE PHOTOSENSITIZERS AND APPLICATION THEREOF

(71) Applicants: Changzhou Tronly New Electronic Materials Co., Ltd., Changzhou (CN); Changzhou Tronly Advanced Electronic Materials Co., Ltd., Changzhou (CN)

(72) Inventor: Xiaochun Qian, Changzhou (CN)

(73) Assignees: CHANGZHOU TRONLY NEW ELECTRONIC MATERIALS CO., LTD., Jiangsu (CN); CHANGZHOU TRONLY ADVANCED ELECTRONIC MATERIALS CO., LTD., Jiangsu (CN)

( * ) Notice: Subject to any disclaimer, the term of this patent is extended or adjusted under 35 U.S.C. 154(b) by 481 days.

(21) Appl. No.: 17/777,322

(22) PCT Filed: Nov. 24, 2020

(86) PCT No.: PCT/CN2020/130998

§ 371 (c)(1),
(2) Date: May 17, 2022

(87) PCT Pub. No.: WO2021/104224

PCT Pub. Date: Jun. 3, 2021

(65) Prior Publication Data

US 2023/0016182 A1 Jan. 19, 2023

(30) Foreign Application Priority Data

Nov. 25, 2019 (CN) ......................... 201911162344.1

(51) Int. Cl.
*G03F 7/031* (2006.01)
*G03F 7/004* (2006.01)

(52) U.S. Cl.
CPC ............ *G03F 7/031* (2013.01); *G03F 7/0045* (2013.01)

(58) Field of Classification Search
CPC ............................... G03F 7/031; G03F 7/0045
See application file for complete search history.

(56) References Cited

U.S. PATENT DOCUMENTS

| | | | | |
|---|---|---|---|---|
| 3,997,708 | A | 12/1976 | Brown et al. | |
| 2004/0235992 | A1* | 11/2004 | Okada | C08F 283/04 524/115 |
| 2012/0040290 | A1* | 2/2012 | Ajioka | G03F 7/031 430/286.1 |
| 2015/0038662 | A1* | 2/2015 | Takamura | C08F 220/286 560/224 |

FOREIGN PATENT DOCUMENTS

| | | | |
|---|---|---|---|
| CN | 101525392 | | 9/2009 |
| CN | 102341753 | | 2/2012 |
| CN | 102675203 | | 9/2012 |
| CN | 102952071 | | 3/2013 |
| CN | 102981357 | | 3/2013 |
| CN | 103076719 | | 5/2013 |
| CN | 105629662 | | 6/2016 |
| CN | 107765510 | | 3/2018 |
| CN | 108241259 | | 7/2018 |
| CN | 114085358 | A | 2/2022 |
| EP | 0780376 | A1 | 6/1997 |
| JP | 2006-313348 | | 11/2006 |
| JP | 2013068936 | | 4/2013 |
| JP | 2019524757 | | 9/2019 |
| WO | WO 2010103918 | | 9/2010 |

OTHER PUBLICATIONS

Office Action in Japanese Appln. No. 2022-530827, dated Apr. 11, 2023, 4 pages (with English translation).
International Search Report in International Appln. No. PCT/CN2020/130998, dated Feb. 23, 2021, 2 pages (English Translation).
Office Action in Chinese Appln. No. 201911162344.1, dated Oct. 9, 2021, 8 pages (with English Translation).

* cited by examiner

*Primary Examiner* — Jonathan Johnson
*Assistant Examiner* — Jayson D Cosgrove
(74) *Attorney, Agent, or Firm* — Fish & Richardson P.C.

(57) ABSTRACT

An EO/PO modified 9-phenylacridine photosensitizer having the structure as shown in general formula (I). When the photosensitizer is applied to a photosensitive resin composition, the composition has characteristics of high photosensitivity, high resolution, high solubility, excellent dispersion stability, and excellent developing property, and has good hydrophilicity during development, the amount of sludges in a developer during recycling can be significantly reduced, so that the developer can be used repeatedly and effectively.

(I)

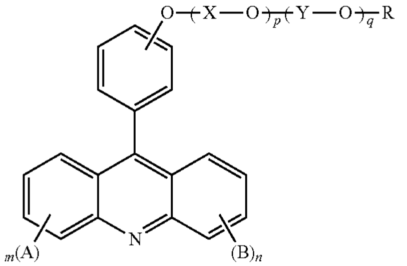

6 Claims, No Drawings

EO/PO-MODIFIED 9-PHENYLACRIDINE PHOTOSENSITIZERS AND APPLICATION THEREOF

CROSS-REFERENCE TO RELATED APPLICATIONS

This application is a U.S. National Phase application under 35 U.S.C. § 371 of International Patent Application No. PCT/CN2020/130998, filed on Nov. 24, 2020, which claims priority to Chinese Application No. 201911162344.1, filed on Nov. 25, 2019. The entire contents of the parent applications are hereby incorporated by reference.

TECHNICAL FIELD

The present invention belongs to the technical field of photocuring and organic chemistry, and specifically relates to EO/PO modified 9-phenylacridine photosensitizers and uses thereof.

BACKGROUND

With the miniaturization of printed circuit boards in the precision electronic equipment, photosensitive resin compositions with high photosensitivities, high resolutions, high solubilities, and less developing wastes have become a research hotspot. As a key component of the photosensitive resin composition, the photosensitizer is required to have properties such as high sensitivity, high resolution, high solubility, excellent dispersion stability, and less developing wastes.

Acridine compounds are a very important class of photosensitizers. For example, patent applications CN101525392A, CN102675203A, etc. disclose the uses of different acridine compounds in the photosensitive resins. However, when these existing acridine compounds are used as photosensitizers, there are disadvantages such as unsatisfactory solubility, poor dispersion stability, and more developing wastes. The sufficient dissolution and dispersion of the photosensitizer is directly related to its initiation efficiency in the resin system.

9-Phenylacridine is one of the most widely used products in the existing acridine photosensitizers, but the photosensitive resin compositions using 9-phenylacridines as photosensitizers cannot combine all advantages of high sensitivity, high resolution, high solubility, high dispersion stability, and less developing wastes, at the time of forming a resist pattern. 9-Phenylacridines often have problems such as poor intersolubility with the system as well as easy agglomeration and precipitation during use, which reduce the initiation efficiency and affect the material performances. In the dry film development stage, the unexposed portion is usually washed away with an alkaline aqueous solution, and 9-phenylacridine will be precipitated and adsorbed on the surface of the circuit board at this time, due to its extremely low solubility. This will not only affect the use of the dry film, but also reduce the precision of the product. Thus, it is necessary to subsequently add a cleaning process of the surface of the circuit board, resulting in a cumbersome process and a great increase in cost.

Patent application CN107765510A discloses a 9-phenylacridine macromolecular photosensitizer and solves the problems of solubility and developing waste. However, in practical uses, it is found that there will be more oil slicks during the development, which affects the recycling of the developer. Therefore, there is a need for further optimization.

SUMMARY

In view of the deficiencies and use requirements in the prior art, first, an object of the present invention is, at first, to provide EO/PO modified 9-phenylacridine photosensitizers.

The EO/PO modified 9-phenylacridine photosensitizer of the present invention has the structure as shown in general formula (I):

(I)

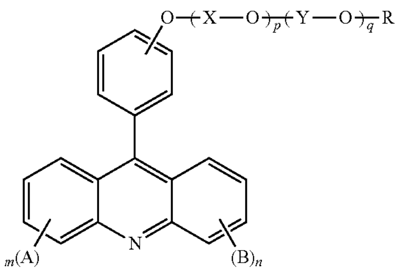

wherein,

X and Y each independently denote —$CH_2$—$CH_2$— or —$CH(CH_3)$—$CH_2$—;

p and q each independently denote an integer from 0 to 9, and both are not 0 at the same time;

R denotes hydrogen or $C_1$-$C_{20}$ hydrocarbyl;

A and B each independently denote halogen, nitro, cyano, amino, $C_1$-$C_{20}$ hydrocarbyl, $C_1$-$C_8$ alkoxy, and $C_1$-$C_8$ alkylamino, and wherein —$CH_2$— can be optionally replaced with —O—, —S—, and —NH—;

m and n each independently denote an integer from 0 to 4.

An object of the present invention is also to provide a photosensitive resin composition comprising the above-mentioned EO/PO modified 9-phenylacridine photosensitizer, and the use of this composition in the manufacture of printed circuit boards, protective patterns, conductor patterns, lead frames, semiconductor packages, and the like.

When the above-mentioned EO/PO modified 9-phenylacridine photosensitizer of the present invention is applied in the photosensitive resin composition, the composition has characteristics such as high photosensitivity, high resolution, high solubility, excellent dispersion stability, and excellent developing property, as well as better hydrophilicity during development, and can significantly reduce the amount of sludges in the recycled developer, so that the developer can be repeated for many times and effectively used.

DETAILED DESCRIPTION OF THE INVENTION

In terms of the above purposes of the present invention, each aspect will be described in more detail below.

The terms "sludge" and "developing waste" in this application refer to substances accumulated in the developer, which are insoluble in the developer and will re-deposit on the developed substrate, thereby reducing the efficiency of the developer.

For those skilled in the art with ordinary technical knowledge, it should be easily understood that, with regard to the definitions for numerical ranges, in addition to the explicitly stated endpoint values, it also includes all specific point values between the upper and lower limits, and these point values should be considered as being clearly stated in the description. For example, for "an integer from 0 to 9", in addition to the endpoint values 0 and 9, it should be considered that 1, 2, 3, 4, 5, 6, 7, and 8 have also been expressly recited in the description. Similarly, the definitions such as "$C_1$-$C_{20}$ hydrocarbyl" also have the same meaning.

<EO/PO Modified 9-phenylacridine Photosensitizers>

As mentioned above, the EO/PO modified 9-phenylacridine photosensitizer of the present invention has the structure as shown in general formula (I):

(I)

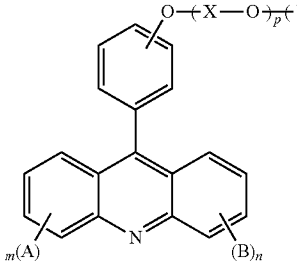

wherein,

X and Y each independently denote —$CH_2$—$CH_2$— or —$CH(CH_3)$—$CH_2$—;

p and q each independently denote an integer from 0 to 9, and both are not 0 at the same time;

R denotes hydrogen or $C_1$-$C_{20}$ hydrocarbyl;

A and B each independently denote halogen, nitro, cyano, amino, $C_1$-$C_{20}$ hydrocarbyl, $C_1$-$C_8$ alkoxy, and $C_1$-$C_8$ alkylamino, and wherein —$CH_2$— can be optionally replaced with —O—, —S—, and —NH—;

m and n each independently denote an integer from 0 to 4.

X and Y each independently denote —$CH_2$—$CH_2$— or —$CH(CH_3)$—$CH_2$—, that is, XO and YO each independently denote oxyethylene group or oxypropylene group. Regarding such structures, it should be easily understood that in the case where oxyethylene groups and oxypropylene groups both exist and the numbers are both greater than 1, they can be configured in a block form (block copolymerization) or in a random form (random copolymerization).

Preferably, p+q is less than or equal to 9. From the viewpoint of cost, production yield, etc., it is further preferable that p+q is less than or equal to 6.

From the viewpoint of synthesis convenience and cost, R is preferably hydrogen, $C_1$-$C_6$ linear or branched alkyl, and benzyl.

Preferably, A and B each independently denote halogen, nitro, cyano, $C_1$-$C_{10}$ hydrocarbyl, $C_1$-$C_5$ alkoxy, $C_1$-$C_5$ alkylamino, and wherein —$CH_2$— can be optionally replaced with —O—, —S—, and —NH—.

Preferably, m and n each independently denote 0 or 1. Further preferably, m and n both denote 0.

Without the limitation to any existing theory, it is found in practice that the EO/PO modified 9-phenylacridine photosensitizer of the present invention is water-soluble or water-emulsifiable, and this characteristic eliminates or at least reduces the accumulation of drosses and residues in the developer and stripper solutions, as well as the deposition of uncured photoresist on devices and printed circuit boards.

Correspondingly, the present invention also relates to the preparation method for the above-mentioned EO/PO modified 9-phenylacridine photosensitizer, including the following steps:

(1) Reacting a raw material a and a raw material b under the action of a catalyst to obtain an intermediate A;

(2) Reacting a raw material c and a raw material d in a solvent containing an acid-binding agent to obtain an intermediate B;

(3) Reacting the intermediate A and the intermediate B in a solvent containing an acid-binding agent to obtain a product C;

The reaction equation is as follows:

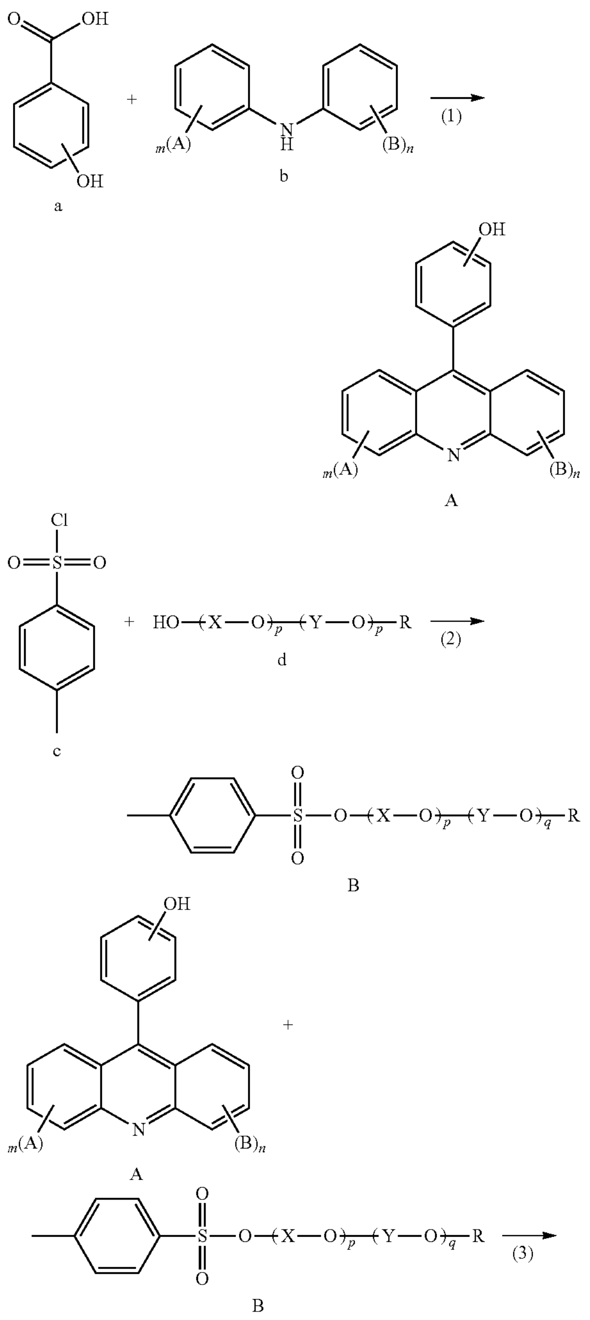

-continued

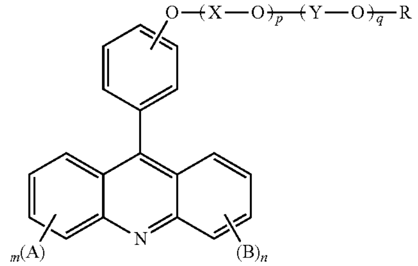

C

The photosensitizer of the present invention is the improvement and optimization to the existing compound structure. As shown in the above reaction equation, the synthesis involved in the preparation method involves acridine structure construction, etherification, etc., all of which are conventional processes in the field of organic chemistry. When the synthesis process and its principle are clarified, the specific process parameters can be easily determined by those skilled in the art. For example, reference may be made to the contents described in Chinese Patent CN101525392A, which is hereby incorporated by reference in its entirety.

Preferably, in step (1), the catalyst is a composite catalyst of zinc chloride and 85% phosphoric acid. The reaction temperature varies slightly depending upon the types of raw materials, usually 150-220° C., and the reaction time is 4-8 h.

Preferably, in step (2), the type of solvent used is not particularly limited, as long as it can dissolve the reaction raw materials and have no adverse effects on the reaction, such as dichloromethane, dichloroethane, acetonitrile, N,N-dimethylformamide, etc. The acid-binding agent can be sodium carbonate, sodium hydroxide, potassium carbonate, sodium methoxide, pyridine, triethylamine and the like. The reaction temperature is 0-100° C., and the reaction time is usually 1-6 h.

Preferably, in step (3), the type of solvent used is not particularly limited, as long as it can dissolve the reaction raw materials and have no adverse effects on the reaction, such as acetonitrile, N,N-dimethylformamide, N,N-diethylformamide, etc. The acid-binding agent can be sodium carbonate, sodium hydroxide, potassium carbonate, sodium methoxide, pyridine, triethylamine and the like. The reaction temperature is 60-140° C., and the reaction time is usually 4-10 h.

<Photosensitive Resin Composition>

The EO/PO modified 9-phenylacridine photosensitizer of the present invention has excellent performances when applied in the photosensitive resin composition. Thus, accordingly, the present invention also provides a photosensitive resin composition, characterized in comprising the following components:

(A) an alkali-soluble polymer;

(B) a compound having an ethylenically unsaturated double bond;

(C) the above EO/PO modified 9-phenylacridine photosensitizer;

(D) a photoacid generator, having the structure as shown in the general formula (II):

(II)

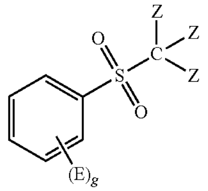

wherein, E denotes halogen, aryl, heterocyclyl, $C_1$-$C_6$ linear or branched alkyl, or $NR'_2$, R' denoting hydrogen or $C_1$-$C_6$ linear or branched alkyl; g denotes an integer from 0 to 5; and Z denotes halogen;

(E) other optional auxiliary agents.

Each component will be described in more detail below.

Alkali-Soluble Polymer (A)

The alkali-soluble polymer can impart a film-forming function to the photosensitive resin composition. As the alkali-soluble polymer, the polymer having such characteristics can be used without particular limitations.

Exemplarily, the suitable alkali-soluble polymer can be (meth)acrylic polymers, styrenic polymers, epoxy polymers, aliphatic polyurethane (meth)acrylate polymers, aromatic polyurethane (meth)acrylate polymers, amide resins, amide epoxy resins, alkyd resins, phenolic resins, etc.

Further, the alkali-soluble polymer can be obtained by the radical polymerization of polymerizable monomers. Examples of polymerizable monomers include: polymerizable styrene derivatives substituted at the α-position or aromatic ring such as styrene, vinyltoluene, α-methylstyrene, p-methylstyrene, p-ethylstyrene, and p-chlorostyrene; acrylamide derivatives, such as acrylamide and diacetone acrylamide; ether derivatives of vinyl alcohol, such as acrylonitrile and vinyl n-butyl ether; (meth)acrylic acid derivatives, such as (meth)acrylic acid, α-bromo(meth) acrylic acid, α-chloro(meth)acrylic acid, β-furyl(meth) acrylic acid, and β-styryl(meth)acrylic acid; (meth)acrylate compounds, such as alkyl (meth)acrylate, benzyl (meth) acrylate, phenoxy ethyl methacrylate, tetrahydrofurfuryl (meth)acrylate, dimethylaminoethyl (meth)acrylate, diethylaminoethyl (meth)acrylate, glycidyl (meth)acrylate, 2,2,2-trifluoroethyl (meth)acrylate, 2,2,3,3-tetrafluoropropyl (meth)acrylate, 2-ethylhexyl (meth)acrylate, tetrahydrofurfuryl (meth)acrylate, dimethylaminoethyl (meth)acrylate, diethylaminoethyl (meth)acrylate, and glycidyl (meth)acrylate; maleic acid, maleic anhydride, and maleic acid monoesters such as monomethyl maleate, monoethyl maleate, and monoisopropyl maleate; fumaric acid, cinnamic acid, α-cyanocinnamic acid, itaconic acid, crotonic acid, propanolic acid, N-vinylcaprolactam; N-vinylpyrrolidone, etc. These polymerizable monomers may be used alone or in combination of two or more.

Further, from the viewpoint of alkali developing property and adhesion, it is preferable to use a carboxy-containing alkali-soluble polymer. The carboxy-containing alkali-soluble polymer may be an acrylic resin comprising (meth) acrylic acid as a monomer unit, which introduces a carboxyl group by using (meth)acrylic acid as a monomer unit; and may be a copolymer further comprising alkyl (meth)acrylate as a monomer unit in addition to (meth)acrylic acid; and may also be a copolymer further containing a polymerizable monomer (such as a monomer having an ethylenically unsaturated group) other than (meth)acrylic acid and alkyl (meth)acrylate as a monomer unit in addition to (meth) acrylic acid.

Further, the carboxy-containing alkali-soluble polymer can be obtained by radical polymerization of carboxy-containing polymerizable monomers and other polymerizable monomers, and especially is a (meth)acrylate polymer formed by the copolymerization of (meth)acrylates, ethylenically unsaturated carboxylic acids, and other copolymerizable monomers.

The (meth)acrylate may be methyl (meth)acrylate, ethyl (meth)acrylate, propyl (meth)acrylate, butyl (meth)acrylate, pentyl (meth)acrylate, hexyl (meth)acrylate, heptyl (meth) acrylate, octyl (meth)acrylate, -2-ethylhexyl (meth)acrylate, nonyl (meth)acrylate, decyl (meth)acrylate, undecyl (meth) acrylate, dodecyl(meth)acrylate, cyclohexyl (meth)acrylate, benzyl (meth)acrylate, diethylaminoethyl (meth)acrylate, dimethylaminoethyl (meth)acrylate, hydroxyethyl (meth) acrylate, hydroxypropyl (meth)acrylate, furfuryl (meth) acrylate, glycidyl (meth)acrylate, etc. These (meth)acrylates may be used alone or in combination of two or more.

The ethylenically unsaturated carboxylic acid may be acrylic acid, methacrylic acid, butenoic acid, maleic acid, fumaric acid, and itaconic acid, particularly preferably acrylic acid and methacrylic acid. These ethylenically unsaturated carboxylic acids may be used alone or in combination of two or more.

The other copolymerizable monomer may be (meth) acrylamide, n-butyl (meth)acrylate, styrene, vinyl naphthalene, (meth)acrylonitrile, vinyl acetate, and vinyl cyclohexane, etc. These other copolymerizable monomers may be used alone or in combination of two or more.

The alkali-soluble polymer may be used alone or in combination of two or more. As the alkali-soluble polymer used in combination of two or more, two or more alkali-soluble polymers composed of different copolymerization components, two or more alkali-soluble polymers with different weight average molecular weights, and two or more alkali-soluble polymers having different dispersities, etc. can be exemplified.

In the photosensitive resin composition of the present invention, the weight average molecular weight of the alkali-soluble polymer is not particularly limited, and it should be adapted to the specific use environment. Under comprehensive consideration of mechanical strength and alkali developing property, the weight average molecular weight is preferably 15000-200000, more preferably 30000-150000, and particularly preferably 30000-120000. When the weight average molecular weight is greater than 15000, the developer resistance after exposure tends to be further improved. When the weight average molecular weight is less than 200000, the development time tends to become shorter, and the compatibility with other components such as photoinitiator can be maintained. The weight average molecular weight of the alkali-soluble polymer is measured by a gel permeation chromatography (GPC), and is obtained by conversion using a standard curve of standard polystyrene.

Further, from the viewpoint of good alkali developing property, the acid value of the alkali-soluble polymer is preferably 50-300 mgKOH/g, more preferably 50-250 mgKOH/g, further preferably 70-250 mgKOH/g, and particularly preferably 100-250 mgKOH/g. When the acid value of the alkali-soluble polymer is less than 50 mgKOH/g, it is difficult to ensure a sufficient development speed. When it exceeds 300 mgKOH/g, the adhesion is reduced, the pattern short-circuiting is prone to occur, and it is likely to have problems such as reduced storage stability of the composition and increased viscosity.

The molecular weight distribution [weight average molecular weight (Mw)/number average molecular weight (Mn)] of the alkali-soluble resin is preferably 1.5-6.0, and particularly preferably 1.8-3.7. When the molecular weight distribution is within said range, the developing property is excellent.

In 100 parts by mass of the photosensitive resin composition, the content of the alkali-soluble polymer in the composition is preferably 20-70 parts by mass, and more preferably 30-60 parts by mass. When the content of the alkali-soluble polymer is 20 parts by mass or more, it can ensure that the photosensitive resin composition has an improved durability for plating treatment, etching treatment, etc. When the content is 70 parts by mass or less, it is beneficial to improve the sensitivity of the photosensitive resin composition.

Compound Having an Ethylenically Unsaturated Double Bond (B)

The compound having an ethylenically unsaturated double bond can promote the film formation of the photosensitive resin composition.

The compound having an ethylenically unsaturated double bond is not particularly limited, as long as it is a photopolymerizable compound having at least one ethylenically unsaturated bond in the molecule. Exemplarily, the examples include: compounds obtained by reacting α,β-unsaturated carboxylic acids with polyols, bisphenol A-based (meth)acrylate compounds, compounds obtained by reacting α,β-unsaturated carboxylic acids with glycidyl-containing compounds, urethane monomers such as (meth) acrylate compounds having a urethane bond in the molecule, nonylphenoxypolyethyleneoxy (meth)acrylates, γ-chloro-β-hydroxypropyl-β'-(meth)acryloyloxyethyl-phthalates, β-hydroxyethyl-β'-(meth)acryloyloxyethyl-phthalates, β-hydroxypropyl-β'-(meth)acryloyloxyethyl-phthalates, phthalic acid compounds, alkyl (meth)acrylates, etc. These compounds may be used alone or in combination of two or more.

As the above-mentioned compound obtained by reacting α,β-unsaturated carboxylic acid with polyol, the examples may include: polyethylene glycol di(meth)acrylate with an ethylene value of 2-14, propylene oxide di(meth)acrylate with an propylene value of 2-14, polyethylene polypropylene glycol di(meth)acrylate with an ethylene value of 2-14 and an propylene value of 2-14, trimethylolpropane di(meth) acrylate, trimethylolpropane tri(meth)acrylate, EO modified trimethylolpropane tri(meth)acrylate, PO modified trimethylolpropane tri(meth)acrylate, EO,PO modified trimethylolpropane tri(meth)acrylate, tetramethylolmethane tri(meth) acrylate, tetramethylolmethane tetra(meth)acrylate, dipentaerythritol penta(meth)acrylate, dipentaerythritol hexa(meth)acrylate, polypropylene glycol mono (meth)acrylate, polyethylene glycol mono(meth)acrylate, tripropylene glycol di(meth)acrylate, etc. These compounds may be used alone or in combination of two or more.

As the above-mentioned bisphenol A-based (meth)acrylate compound, the examples may include: 2,2-bis {4-[(meth)acryloyloxypolyethoxy]phenyl}propane, 2,2-bis {4-[(meth)acryloyloxypolypropoxy]phenyl}propane, 2,2-bis {4-[(meth)acryloyl oxypolybutoxy]phenyl}propane, 2,2-bis {4-[meth)acryloyloxypolyethoxypolypropoxy] phenyl}propane, etc. As the above-mentioned 2,2-bis{4-[(meth)acryloyloxypolyethoxy]phenyl}propane, the examples may include: 2,2-bis {4-[(meth)acyloyloxydiethoxy]phenyl}propane, 2,2-bis {4-[(meth)acyloyloxytriethoxy]phenyl}propane, 2,2-bis {4-[(meth)acyloyloxytetraethoxy]phenyl}propane, 2,2-bis {4-[(meth) acyloyloxypentaethoxy]phenyl}propane, 2,2-bis {4-[(meth) acyloyloxyhexaethoxy]phenyl}propane, 2,2-bis {4-[(meth) acyloyloxyheptaethoxy]phenyl}propane, 2,2-bis {4-[(meth)

acyloyloxyoctaethoxy]phenyl}propane, 2,2-bis {4-[(meth) acryloyloxynonaethoxy]phenyl}propane, 2,2-bis{4-[(meth) acryloyloxydecaethoxy]phenyl}propane, 2,2-bis{4-[(meth) acryloyloxyundecaethoxy]phenyl}propane, 2,2-bis{4-[(meth)acyloyloxy do decaethoxy]phenyl}propane, 2,2-bis {4-[(meth)acryloyloxytridecaethoxy]phenyl}propane, 2,2-bis{4-[(meth)acryloyloxytetradecaethoxy]phenyl}propane, 2,2-bis{4-[(meth)acryloyloxypentadecaethoxy] phenyl}propane, 2,2-bis{4-[(meth)acryloyloxyhexadecaethoxy]phenyl}propane, etc. The number of oxyethylene groups in one molecule of the above-mentioned 2,2-bis {4-[(meth)acryloyloxy poly ethoxy]phenyl}propane is preferably 4-20, and more preferably 8-15. These compounds may be used alone or in combination of two or more.

As the above-mentioned (meth)acrylate compound having a urethane bond in the molecule, the examples may include: an addition reaction product of (meth)acrylic monomer having an OH group at the β-position with a diisocyanate compound (isophorone diisocyanate, 2,6-toluene diisocyanate, 2,4-toluene diisocyanate, and 1,6-hexamethylene diisocyanate), tris((meth)acryloyloxytetraethylenediol isocyanate)hexamethylene isocyanurate, EO modified urethane di(meth)acrylate, PO modified urethane di(meth)acrylate, EO,PO modified urethane di(meth)acrylate, etc. These compounds may be used alone or in combination of two or more.

As the above-mentioned nonylphenoxypolyethyleneoxyacrylate, the examples may include: nonylphenoxytetraethyleneoxyacrylate, nonylphenoxypentaethyleneoxyacrylate, nonylphenoxyhexaethyleneoxyacrylate, nonylphenoxyheptaethyleneoxyacrylate, nonylphenoxyoctaethyleneoxyacrylate, nonylphenoxynonaethyleneoxyacrylate, nonylphenoxydecaethyleneoxyacrylate, nonylphenoxyundecaethyleneoxyacrylate, etc. These compounds may be used alone or in combination of two or more.

As the above-mentioned phthalic acid compound, the examples may include: γ-chloro-β-hydroxypropyl-β'-(meth) acryloyloxyethyl phthalate, β-hydroxyalkyl-β'-(meth)acryloyloxy alkyl phthalate, etc. These compounds may be used alone or in combination of two or more.

As the above-mentioned alkyl (meth)acrylate, the examples may include: methyl (meth)acrylate, ethyl (meth) acrylate, n-propyl (meth)acrylate, isopropyl (meth)acrylate, n-butyl (meth)acrylate, sec-butyl (meth)acrylate, tert-butyl (meth)acrylate, 2-ethylhexyl (meth)acrylate, phenyl (meth) acrylate, isobornyl (meth)acrylate, hydroxymethyl (meth) acrylate, hydroxyethyl (meth)acrylate, hydroxypropyl (meth)acrylate, 2-hydroxyethyl (meth)acrylate, 2-hydroxypropyl (meth)acrylate, benzyl (meth)acrylate, pentyl (meth) acrylate, tetrahydrofurfuryl (meth)acrylate, isooctyl (meth) acrylate, ethoxylated nonylphenol (meth)acrylate, propylene glycol polypropylene ether di(meth)acrylate, 1,9-nonanediol di(meth)acrylate, 1,10-decanediol di(meth)acrylate, ethoxylated polytetrahydrofurandiol di(meth)acrylate, ethoxylated polypropylene glycol di(meth)acrylate, etc. Among them, methyl (meth)acrylate, ethyl (meth)acrylate, trimethylolpropane tri(meth)acrylate, ethoxylated trimethylolpropane tri (meth)acrylate, pentaerythritol tri(meth)acrylate, ethoxylated pentaerythritol tetra(meth)acrylate, dipentaerythritol penta(meth)acrylate, and dipentaerythritol hexaacrylate are preferable. These compounds may be used alone or in combination of two or more.

From the viewpoint of improving resolution, plating resistance, and adhesion, the compound having an ethylenically unsaturated double bond is preferably the (meth) acrylate compound having an urethane bond in the molecular and the bisphenol A-based (meth)acrylate compound. From the viewpoint of improving sensitivity and resolving degree, the bisphenol A-based (meth)acrylate compound is preferable. Exemplarily, as a commercially available product of the bisphenol A-based (meth)acrylate compound, 2,2-bis{4-[meth)acryloyloxypolyethoxy]phenyl}propane (manufactured by Shin-nakamura Chemical Co. Ltd., BPE-200), 2,2-bis{4-[(meth)acryloyloxypolypropoxy]phenyl) propane (manufactured by Shin-nakamura Chemical Co. Ltd., BPE-5000; manufactured by Hitachi Chemical Co., Ltd., FA-321M), 2,2-bis{4-[(meth)acryloyloxypolybutoxy] pheny}propane (manufactured by Shin-nakamura Chemical Co. Ltd., BPE-1300), etc, are included.

In 100 parts by mass of the photosensitive resin composition, the content of the compound having an ethylenically unsaturated double bond (B) is preferably 20-50 parts by mass, and more preferably 25-45 parts by mass. When the content of the compound having an ethylenically unsaturated double bond is more than 20 parts by mass, the sensitivity and resolving degree of the photosensitive resin composition will be further improved; and when said content is 50 parts by mass or less, the film formation for the photosensitive resin composition is more easy, and the durability against etching treatment is further improved.

EO/PO Modified 9-phenylacridine Photosensitizer (C)

Within the defined scope in the above-mentioned features, exemplarily, the EO/PO modified 9-phenylacridine photosensitizer of the present invention can be selected from or include:

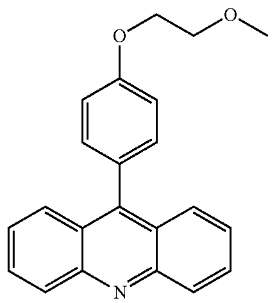
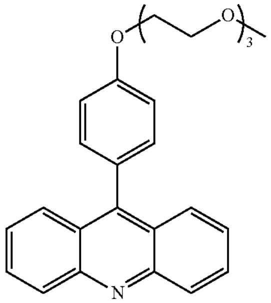
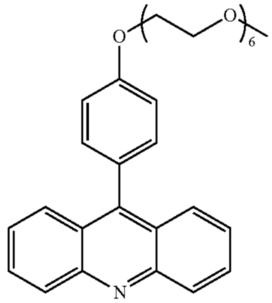
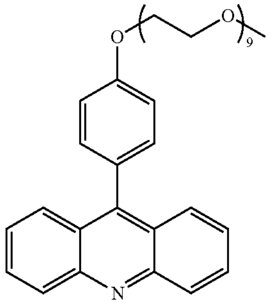
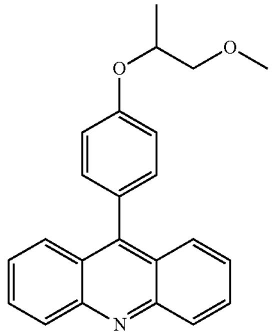
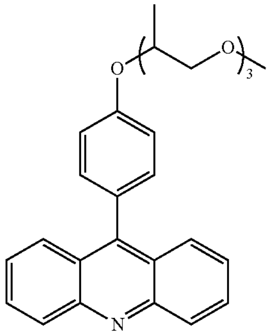

-continued

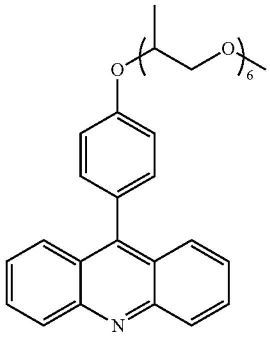

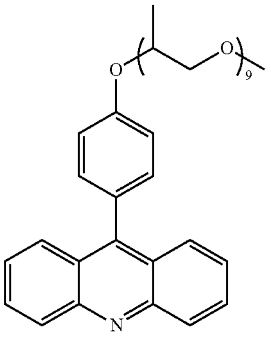

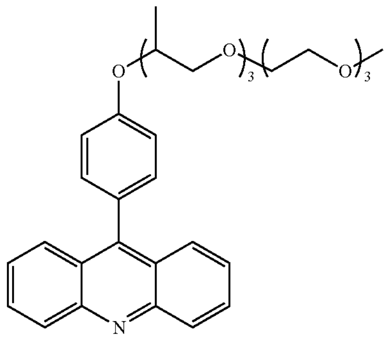

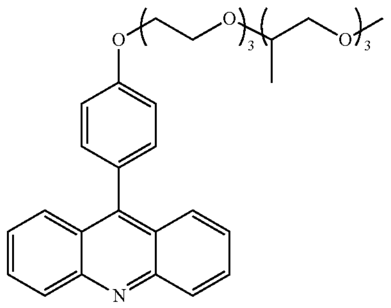

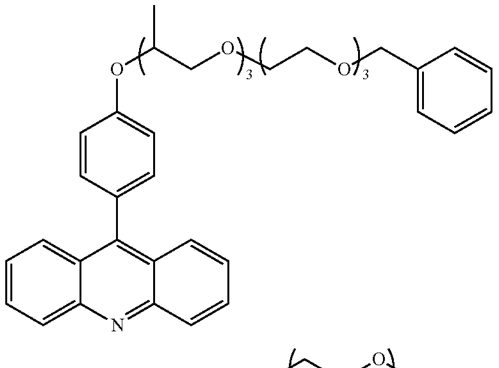

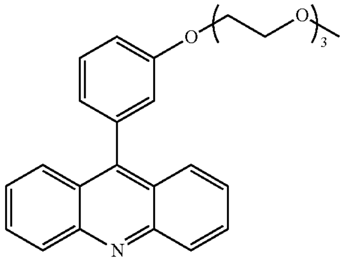

-continued

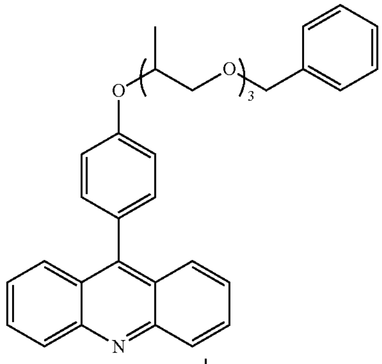

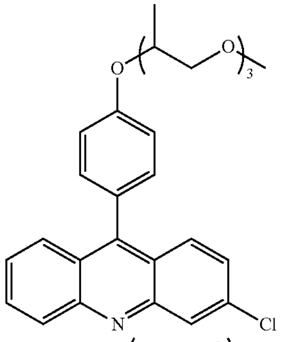

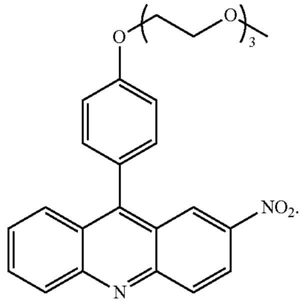

As the EO/PO modified 9-phenylacridine photosensitizer of the present invention (such as the above compounds) can be used alone or in combination of two or more.

In 100 parts by mass of the photosensitive resin composition, the content of the EO/PO modified 9-phenylacridine photosensitizer (C) is 1-20 parts by mass, preferably 1-10 parts by mass. If the content is too small, there is a defect of reduced photosensitivity; if the content is too large, there is a defect that the photoresist pattern tends to become wider than the line width of the photomask.

Photoacid Generator (D)

As described above, the photoacid generator (D) of the present invention has a structure as shown in the general formula (II):

(II)

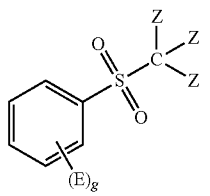

wherein,

E denotes halogen, aryl, heterocyclyl, $C_1$-$C_6$ linear or branched alkyl, or $NR'_2$, R' denoting hydrogen or $C_1$-$C_6$ linear or branched alkyl;

g denotes an integer from 0 to 5; and Z denotes halogen;

As a preferred embodiment, E denotes halogen, $C_1$-$C_6$ linear or branched alkyl, or $NR'_2$, R' denoting hydrogen or $C_1$-$C_6$ linear or branched alkyl.

Preferably, g denotes 0 or 1.

Exemplarily, the examples of photoacid generator (D) include (but not limited to): tribromomethylphenylsulfone, trichloromethylphenylsulfone, tribromomethyl-(4-methylphenyl)sulfone, tribromomethyl-(4-bromophenyl)sulfone, tribromomethyl-(4-chlorophenyl)sulfone, etc. Particularly preferably, the photoacid generator (D) is tribromomethylphenylsulfone.

In 100 parts by mass of the photosensitive resin composition, the content of the photoacid generator (D) is preferably 0.01-10 parts by mass. The content is preferably 0.01 parts by mass or more from the viewpoint of being able to recognize sufficient colorability (chromophoric property), and preferably 10 parts by mass or less from the viewpoints of creating a contrast between the exposed portion and the unexposed portion and maintaining the storage stability.

Other Optional Auxiliary Agents (E)

In addition to the above-mentioned components, optionally, the photosensitive resin composition of the present invention may further comprise an appropriate amount of other auxiliary agents as needed. Exemplarily, the auxiliary agent may include at least one of other photoinitiators and/or sensitizers, hydrogen donors, dyes, pigments, light chromogenic reagents, fillers, plasticizers, stabilizers, coating aids, stripping promoters, and the like.

The other photoinitiators and/or sensitizers may include (but not limited to) biimidazoles, aromatic ketones, anthraquinones, benzoins and benzoin alkyl ethers, oxime esters, triazines, coumarins, thioxanthones, acridines, and other photoinitiator known to those skilled in the art.

Exemplarily, the biimidazole compounds include: 2,2'-bis(o-chlorophenyl)-4,4',5,5'-tetraphenyl-diimidazole, 2,2',5-tris(o-chlorophenyl)-4-(3,4-dimethoxyphenyl)-4',5'-diphenyl-1,1'-diimidazole, 2,2',5-tris(2-fluorophenyl)-4-(3,4-dimethoxyphenyl)-4',5'-diphenyl-diimidazole, 2,2'-bis(2,4-dichlorophenyl)-4,4',5,5'-tetraphenyl-diimidazole, 2,2'-bis(2-fluorophenyl)-4-(o-chlorophenyl)-5-(3,4-dimethoxyphenyl)-4',5'-diphenyl-diimidazole, 2,2'-bis(2-fluorophenyl)-4,4',5,5'-tetraphenyl-diimidazole, 2,2'-bis(2-methoxyphenyl)-4,4',5,5'-tetraphenyl-diimidazole, 2,2'-bis(2-chloro-5-nitrophenyl)-4,4'-bis(3,4-dimethoxyphenyl)-5,5'-bis(o-chlorophenyl)-diimidazole, 2,2'-bis(2-chloro-5-nitrophenyl)-4-(3,4-dimethoxyphenyl)-5-(o-chlorophenyl)-4',5'-diphenyl-diimidazole, 2,2'-bis(2,4-dichlorophenyl)-4,4'-bis(3,4-dimethoxyphenyl)-5,5'-bis(o-chlorophenyl)-diimidazole, 2-(2,4-dichlorophenyl)-4-(3,4-dimethoxyphenyl)-2',5-bis(o-chlorophenyl)-4',5'-diphenyl-diimidazole, 2-(2,4-dichlorophenyl)-2'-(o-chlorophenyl)-4,4',5,5'-tetraphenyl-diimidazole, 2,2'-bis(2,4-dichlorophenyl)-4,4',5,5'-tetraphenyl-diimidazole, and analogues thereof. These biimidazole compounds may be used alone or in combination of two or more.

Exemplarily, the aromatic ketone compounds include: acetophenone, 2,2-dimethoxy-2-phenylacetophenone, 2,2-diethoxy-2-phenylacetophenone, 1,1-dichloro acetophenone, benzophenone, 4-benzoyl diphenyl sulfide, 4-benzoyl-4'-methyl diphenyl sulfide, 4-benzoyl-4'-ethyl diphenyl sulfide, 4-benzoyl-4'-propyl diphenyl sulfide, 4,4'-bis(diethylamino)benzophenone, 4-tolylthiobenzophenone, 2,4,6-trimethylbenzophenone, 4-methylbenzophenone, 4,4'-bis(dimethylamino)benzophenone, 4,4'-bis(methyl, ethylamino)benzophenone, acetophenone dimethyl ketal, benzil dimethyl ketal, α,α'-dimethylbenzil ketal, α,α'-diethoxyacetophenone, 2-hydroxy-2-methyl-1-phenylacetone, 1-hydroxycyclohexylbenzophenone, 2-hydroxy-2-methyl-1-p-hydroxyethyl ether phenylacetone, 2-methyl 1-(4-methylthiophenyl)-2-morpholine 1-acetone, 2-benzyl-2-dimethylamino-1-(4-morpholinephenyl) 1-butanone, phenylbis(2,4,6-trimethylbenzoyl)phosphine oxide, 2,4,6 (trimethylbenzoyl)diphenylphosphine oxide, 2-hydroxy-1-{3-[4-(2-hydroxy-2-methyl-propionyl))-phenyl]-1,1,3-trimethyl-inden-5-yl}-2-methyl acetone, 2-hydroxy-1-{1-[4-(2-hydroxy-2-methyl-propionyl))-phenyl]-1,3,3-trimethyl-inden-5-yl}-2-methylacetone, 1-(4-isopropylphenyl)-2-hydroxy-2-methylpropan-1-one, 4-(2-hydroxyethoxy)-phenyl-(2-hydroxy-2-propyl)one, and analogues thereof. These aromatic ketone compounds may be used alone or in combination of two or more.

Exemplarily, the anthraquinone compounds include: 2-phenylanthraquinone, 2,3-diphenylanthraquinone, 1-chloroanthraquinone, 2-methylanthraquinone, 2,3-dimethylanthraquinone, 2-ethyl anthracene-9,10-diethyl ester, 1,2,3-trimethyl anthracene-9,10-dioctyl ester, 2-ethylanthracene-9,10-bis(4-chlorobutyric acid methyl ester), 2-{3-[(3-ethyloxetan-3-yl)methoxy]-3-oxopropyl}anthracene-9,10-diethyl ester, 9,10-dibutoxyanthracene, 9,10-diethoxy-2-ethylanthracene, 9,10-bis(3-chloropropoxy)anthracene, 9,10-bis(2-hydroxyethylthio)anthracene, 9,10-bis(3-hydroxy-1-propylthio)anthracene, and analogues thereof. These anthraquinone derivatives may be used alone or in combination of two or more.

Exemplarily, the benzoin and benzoin alkyl ether compounds include: benzoinmethyl ether, benzoinethyl ether, benzoin phenyl ether, and analogues thereof. These benzoin and benzoin alkyl ether compounds may be used alone or in combination of two or more.

Exemplarily, the oxime ester compounds may include: 1-(4-phenylthiophenyl)-n-octane-1,2-dione-2-benzoic acid oxime ester, 1-[6-(2-methylbenzoyl)-9-ethylcarbazol-3-yl]-ethane-1-one-acetic acid oxime ester, 1-[6-(2-methylbenzoyl)-9-ethylcarbazol-3-yl]-butane-1-one-acetic acid oxime ester, 1-[6-(2-methylbenzoyl)-9-ethylcarbazol-3-yl]-propane-1-one-acetic acid oxime ester, 1-[6-(2-methylbenzoyl)-9-ethylcarbazol-3-yl]-1-cyclohexyl-methane-1-one-acetic acid oxime ester, 1-[6-(2-methylbenzoyl)-9-ethylcarbazol-3-yl]-(3-cyclopentyl)-propane-1-one-acetic acid oxime ester, 1-(4-phenylthiophenyl)-(3-cyclopentyl)-propane-1,2-dione-2-benzoic acid oxime ester, 1-(4-phenylthiophenyl)-(3-cyclohexyl)-propane-1,2-dione-2-cyclohexylformic acid oxime ester, 1-[6-(2-methylbenzoyl)-9-ethylcarbazol-3-yl]-(3-cyclopentyl)-propane-1,2-dione-2-acetic acid oxime ester, 1-(6-orthomethylbenzoyl-9-ethylcarbazol-3-yl)-(3-cyclopentyl)-propane-1,2-dione-2-benzoic acid oxime ester, 1-(4-benzoyldiphenyl sulfide)-(3-cyclopentylacetone)-1-oxime acetate, 1-(6-orthomethylbenzoyl-9-ethylcarbazol-3-yl)-(3-cyclopentylacetone)-1-oximecyclohexylformate, 1-(4-benzoyldiphenyl sulfide)-3-cyclopentylacetone)-1-oximecyclohexylformate, 1-(6-orthomethylbenzoyl-9-ethylcarbazol-3-yl)-(3-cyclopentyl)-propane-1,2-dione-2-orthomethylbenzoic acid oxime ester, 1-(4-phenylthiophenyl)-(3-cyclopentyl)-propane-1,2-dione-2-cyclohexylformic acid oxime ester, 1-(4-thiopheneformyl-diphenyl sulfide-4'-yl)-3-cyclopentyl-propane-1-one-acetic acid oxime ester, 1-(4-benzoyldiphenyl sulfide)-(3-cyclopentyl)-propane-1,2-dione-2-oxime acetate, 1-(6-nitro-9-ethylcarbazol-3-yl)-3-cyclohexyl-propane-1-one-acetic acid oxime ester, 1-(6-orthomethylbenzoyl-9-ethylcarbazol-3-yl)-3-cyclohexyl-propane-1-one-acetic acid oxime ester, 1-(6-thiopheneformyl-9-ethylcarbazol-3-yl)-(3-cyclohexyl acetone)-1-oxime acetate, 1-(6-furanfuroyl-9-ethylcarbazol-3-yl)-(3-cyclopentylacetone)-1-oxime acetate, 1,4-diphenyl-propane-1,3-dione-2-acetic acid oxime ester, 1-(6-furoyl-9-ethylcarbazol-3-yl)-(3-cyclohexyl)-propane-1,2-dione-2-acetic acid oxime ester, 1-(4-phenylthiophenyl)-(3-cyclohexyl)-propane-1,2-dione-2-acetic acid oxime ester, 1-(6-furanfuroyl-9-ethylcarbazol-3-yl)-(3-cyclohexylacetone)-1-oxime acetate, 1-(4-phenylthiophenyl)-(3-cyclohexyl)-propane-1,2-dione-3-benzoic acid oxime ester, 1-(6-thiopheneformyl-9-ethylcarbazol-3-yl)-(3-cyclohexyl)-propane-1,2-dione-2-acetic acid oxime ester, 2-[(benzoyloxy)imino]-1-phenylpropane-1-one, 1-phenyl-1,2-propanedione-2-(oxoacetyl)oxime, 1-(4-phenylthiophenyl)-2-(2-methylphenyl)-ethane-1,2-dione-2-acetic acid oxime ester, 1-(9,9-dibutyl-7-nitrofluoren-2-yl)-3-cyclohexyl-propane-1-one-acetic acid oxime ester, 1-{4-[4-(thiophene-2-formyl)phenylthiol]phenyl}-3-cyclopentylpropane-1,2-dione-2-acetic acid oxime ester, 1-[9,9-dibutyl-2-yl]-3-cyclohexylpropylpropane-1,2-dione-2-acetic acid oxime ester, 1-[6-(2-benzoyloxyimino)-3-cyclohexylpropyl-9-ethylcarbazol-3-yl]octane-1,2-dione-2-benzoic acid oxime ester, 1-(7-nitro-9,9-diallylfluoren-2-yl)-1-(2-methylphenyl)ketone-acetic acid oxime ester, 1-[6-(2-methylbenzoyl)-9-ethylcarbazol-3-yl]-3-cyclopentyl-propane-1-one-benzoic acid oxime ester, 1-[7-(2-methylbenzoyl)-9,9-dibutylfluoren-2-yl]-3-cyclohexylpropane-1,2-dione-2-acetic acid oxime ester, 1-[6-(furan-2-formyl)-9-ethylcarbazol-3-yl]-3-cyclohexylpropane-1,2-dione-2-ethoxyformyl oxime ester, and analogues thereof. These oxime ester compounds may be used alone or in combination of two or more.

Exemplarily, the triazine compounds include: 2-(4-ethylbiphenyl)-4,6-bis(trichloromethyl)-1,3,5-triazine, 2-(3,4-methyleneoxyphenyl)-4,6-bis(trichloromethyl)-1,3,5-triazine, 3-{4-[2,4-bis(trichloromethyl)-s-triazin-6-yl]phenylthio}propionic acid, 1,1,1,3,3,3-hexafluoroisopropyl-3-{4-[2,4-bis(trichloromethyl)-s-triazin-6-yl]phenylthio}propionate, ethyl-2-{4-[2,4-bis(trichloromethyl)-s-triazin-6-yl]phenylthio}acetate, 2-ethoxy ethyl-2-{4-[2,4-bis(trichloromethyl)-s-triazin-6-yl]phenylthio}acetate, cyclohexyl-2-{4-[2,4-bis(trichloromethyl)-s-triazin-6-yl]phenylthio}acetate, benzyl-2-{4-[2,4-bis(trichloromethyl)-s-triazin-6-yl]phenylthio}acetate, 3-chloro-{4-[2,4-bis(trichloromethyl)-s-triazin-6-yl]phenylthio}propionic acid, 3-{4-[2,4-bis(trichloromethyl)-s-triazin-6-yl]phenylthio}propionamide, 2,4-bis(trichloromethyl)-6-p-methoxystyryl-s-triazine, 2,4-bis(tri chloromethyl)-6-(1-p-dimethylaminophenyl)-1,3-butadienyl-s-triazine, 2-trichloromethyl-4-amino-6-p-methoxystyryl-s-triazine, and analogues thereof. These triazine compounds may be used alone or in combination of two or more.

Exemplarily, the coumarin compounds include: 3,3'-carbonylbis(7-diethylaminocoumarin), 3-benzoyl-7-diethylaminocoumarin, 3,3'-carbonylbis(7-methoxycoumarin), 7-diethylamino-4-methylcoumarin, 3-(2-benzothiazole)-7-(diethylamino)coumarin, 7-(diethylamino)-4-methyl-2H-1-benzopyran-2-one[7-(diethylamino)-4-methylcoumarin], 3-benzoyl-7-methoxy coumarin, and analogues thereof. These coumarin compounds may be used alone or in combination of two or more.

Exemplarily, the thioxanthone compounds include: thioxanthone, 2,4-dimethylthioxanthone, 2,4-diethylthioxanthone, 2,4-diisopropylthioxanthone, 2-chlorothioxanthone, 1-chloro-4-propoxythioxanthone, isopropylthioxanthone, diisopropylthioxanthone, and analogues. These thioxanthone compounds may be used alone or in combination of two or more.

Exemplarily, the acridine compounds include: 9-phenylacridine, 9-p-methylphenylacridine, 9-m-methylphenylacridine, 9-o-chlorophenylacridine, 9-orthofluorophenylacridine, 1,7-bis(9-acridinyl)heptane, 9-ethylacridine, 9-(4-bromophenyl)acridine, 9-(3-chlorophenyl)acridine, 1,7-bis(9-acridine)heptane, 1,5-bis(9-acridinepentane), 1,3-bis(9-acridine)propane, and analogues thereof. These acridine compounds may be used alone or in combination of two or more.

The specific type of the hydrogen donor is not particularly limited, and may include (but not limited to): amine compounds, carboxylic acid compounds, mercapto-containing organosulfur compounds, or alcohol compounds, etc. These compounds may be used alone or in combination of two or more of them. Exemplarily, it may include (but not limited to): triethanolamine, methyl 4-dimethylaminobenzoate, 4,4'-bis(dimethylamino)benzophenone, 4,4'-bis(diethylamino)benzophenone, phenylthioacetic acid, methylphenylthioacetic acid, ethylphenylthioacetic acid, dimethoxyphenylthioacetic acid, chlorophenylthioacetic acid, dichlorophenylthioacetic acid, N-phenylglycine, phenoxyacetic acid, naphthylthioacetic acid, N-naphthylglycine, naphthyloxyacetic acid, 2-mercaptobenzothiazole (MBO), 2-mercaptobenzimidazole (MBI), dodecyl mercaptan, ethylene glycol bis(3-mercaptobutyrate), etc.

Exemplarily, the dye, pigment, and light chromogenic reagent include (but not limited to): tris(4-dimethylaminophenyl)methane (i.e., Leuco Crystal Violet, LCV), tris(4-dimethylamino-2methylphenyl)methane, fluorane dyes, toluenesulfonic acid monohydrate, Basic Fuchsin, phthalocyanines such as phthalocyanine green and phthalocyanine blue, auramine base, parafuchsin, Crystal Violet, Methyl Orange, Nile Blue 2B, Victoria Blue, Malachite Green, Diamond Green, Basic Blue 20, Brilliant Green, Eosin, Ethyl Violet, Erythrosine Sodium B, Methyl Green, phenolphthalein, Alizarin Red S, thymolphthalein, Methyl Violet 2B, Quinadine Red, Rose Bengal Sodium Agar, Mitaniel Yellow, Thymolsulfophthalein, Xylenol Blue, Methyl Orange, Orange IV, dithizone, 2,7-dichlorofluorescein, Paramethyl Red, Congo Red, Benzopurpurin 4B, α-Naphthyl Red, phenacetin, Methyl Violet, Victoria Pure Blue BOH, Rhodamine 6G, diphenylamine, dibenzylaniline, triphenylamine, diethylaniline, di-p-phenylenediamine, p-toluidine, benzotriazole, methyl benzotriazole, 4,4'-biphenyldiamine, o-chloroaniline, White Crystal Violet, White Malachite Green, White Aniline, White Methyl Violet, and azo-based dyes, as well as inorganic pigments such as titanium dioxide, etc. These dyes, pigments, and light chromogenic reagents may be used alone or in combination of two or more.

Exemplarily, the filler includes (but not limited to): a filler such as silica, alumina, talc, calcium carbonate, and barium sulfate (excluding the above-mentioned inorganic pigment), etc. The filler may be used alone or in combination of two or more.

Exemplarily, the plasticizer includes (but not limited to): phthalates such as dibutyl phthalate, diheptyl phthalate, dioctyl phthalate, and diallyl phthalate; glycol esters such as triethylene glycol diacetate and tetraethylene glycol diacetate; sulfonamides such as p-toluenesulfonamide, benzenesulfonamide, and n-butylbenzenesulfonamide; triphenyl phosphate, trimethyl phosphate, triethyl phosphate, triphenyl phosphate, tritolyl phosphate, trixylyl phosphate, tolyl diphenyl phosphate, trixylyl phosphate, 2-naphthyl diphenyl phosphate, tolyl di-2,6-xylyl phosphate, aromatic condensed phosphate, tris(chloropropyl) phosphate, tris(tribromo-neopentyl) phosphate, halogen-containing condensed phosphate, triethylene glycol dicaprylate, triethylene glycol di(2-ethylhexanoate), tetraethylene glycol diheptanoate, diethyl sebacate, dibutyl suberate, tris(2-ethylethyl) phosphate, Brij30 [$C_{12}H_{25}(OCH_2CH_2)_4OH$], and Brij35 [$C_{12}H_{25}(OCH_2CH_2)_{20}OH$]. The plasticizer may be used alone or in combination of two or more.

Exemplarily, the stabilizer includes (but not limited to): hydroquinone, 1,4,4-trimethyl-diazobicyclo(3.2.2)-non-2-ene-2,3-dioxide, 1-phenyl-3-pyrazolidinone, p-methoxyphenol, alkyl and aryl-substituted hydroquinone and quinone, tert-butylcatechol, 1,2,3-benzenetriol, copper resinate, naphthylamine, β-naphthol, cuprous chloride, 2,6-di-tert-butyl-p-cresol, phenothiazine, pyridine, nitrobenzene, dinitrobenzene, p-toluquinone, and chloranil, etc. The stabilizer may be used alone or in combination of two or more.

Exemplarily, the coating aid includes (but not limited to): acetone, methanol, methyl alcohol, ethyl alcohol, isopropyl alcohol, methyl ethyl ketone, propylene glycol monomethyl ether acetate, ethyl lactate, cyclohexanone, γ-butyrolactone, dichloromethane, etc. The coating aid may be used alone or in combination of two or more.

Exemplarily, the stripping promoter includes (but not limited to): benzenesulfonic acid, toluenesulfonic acid, xylenesulfonic acid, phenolsulfonic acid, alkyl (such as methyl, propyl, heptyl, octyl, decyl, dodecyl) benzene sulfonic acid, etc. The stripping promoter may be used alone or in combination of two or more.

<Dry Film and Wet Film Uses>

The photosensitive resin composition of the present invention can be prepared into a dry film (i.e., a photosensitive resin laminate), and used for the manufacture of printed circuit boards, protective patterns, conductor patterns, lead frames, semiconductor packages, to form required patterns on the different substrates through different processes.

The photosensitive resin composition of the present invention can also be directly coated to the corresponding substrate in each corresponding manufacturing step by a wet film coater, that is, applied as a wet film to the manufacture of printed circuit boards, protective patterns, conductor patterns, lead frames, and semiconductor packages, to form required patterns on the different substrates through different processes.

Dry Film Use

The dry film of the present invention (i.e., the photosensitive resin laminate) comprises: a photosensitive resin layer formed of the photosensitive resin composition and a support that supports the photosensitive resin layer.

Generally, the preparation of the dry film includes: coating the photosensitive resin composition on the support and drying the same to form the photosensitive resin layer; optionally, adhering a cover film (protective layer) as needed. Preferably, the drying condition is drying at 60-100° C. for 0.5-15 min. The thickness of the photosensitive resin layer is preferably 5-95 μm, more preferably 10-50 μm, more preferably 15-30 μm. If the thickness of the photosensitive resin layer is less than 5 μm, the insulativity is poor, and if the thickness of the photosensitive resin layer exceeds 95 μm, the resolving degree may be poor.

As the support, specific examples may be various types of plastic films, such as polyethylene terephthalate, polyethylene naphthalate, polypropylene, polyethylene, cellulose acetate, polyalkyl methacrylate, methacrylate copolymer, polyvinyl chloride, polyvinyl alcohol, polycarbonate, polystyrene, cellophane, vinyl chloride copolymer, polyamide, polyimide, vinyl chloride-vinyl acetate copolymer, polytetrafluoroethylene, polytrifluoroethylene, and analogues thereof. In addition, composite materials composed of two or more materials as mentioned above can also be used. It is preferable to use polyethylene terephthalate having excellent light transmittance. The thickness of the support is preferably 5-150 μm, and more preferably 10-50 μm.

The coating of the photosensitive resin composition is not particularly limited. For example, conventional methods such as spray coating, roll coating, spin coating, slit coating, compression coating, curtain coating, dye coating, line coating, blade coating, roll coating, knife coating, spray coating, and dip coating may be used.

Further, the present invention provides use of the above-mentioned dry film in the manufacture of a printed circuit board, including:

(1) Laminating process: laminating the photosensitive resin laminate on a copper clad laminate or flexible substrate;

(2) Exposure process: exposing the photosensitive resin layer in the photosensitive resin laminate by irradiating an active light in an image form to perform photo-curing of the exposed portion;

(3) Development process: removing the unexposed portion of the photosensitive resin layer using a developer, to form a protective pattern;

(4) Conductor pattern formation process: etching or plating the portion of the surface of the copper clad laminate or flexible substrate that is not covered by the protective pattern;

(5) Peeling process: peeling the protective pattern from the copper clad laminate or flexible substrate.

Further, the present invention provides use of the above-mentioned dry film in the manufacture of a protective pattern, including the laminating process, exposure process, and development process as described above, with the exception that the photosensitive resin laminate may be laminated on various substrates of different materials in the laminating process.

Further, the present invention provides use of the above-mentioned dry film in the manufacture of a conductor pattern, including the laminating process, exposure process, development process, and conductor pattern formation process as described above, with the exception of laminating the photosensitive resin laminate on a metal sheet or metal coated insulating sheet in the laminating process.

Further, the present invention provides use of the above-mentioned dry film in the manufacture of a lead frame, including the laminating process, exposure process, development process, and conductor pattern formation process as described above, with the exception of laminating the photosensitive resin laminate on a metal sheet in the laminating process, and etching the portion not covered by the protective pattern in the conductor pattern formation process.

Further, the present invention provides use of the above-mentioned dry film in the manufacture of a semiconductor package, including the laminating process, exposure process, development process, and conductor pattern formation process as described above, with the exception of laminating the photosensitive resin laminate on a wafer with large-scale integrated circuits in the laminating process, and plating the portion not covered by the protective pattern in the conductor pattern formation process.

Wet Film Use

The photosensitive resin composition of the present invention can be directly coated on a substrate by a wet film method, to be used in the manufacture of printed circuit boards, protective patterns, conductor patterns, lead frames, semiconductor packages, etc.

Without limitation, the photosensitive resin composition may be coated on the substrate by a conventional method such as roll coating, knife coating, spray coating, and dip coating, and dried to form a photosensitive resin layer.

After the photosensitive resin layer is formed on the substrate, the subsequent processes such as exposure process, development process, conductor pattern formation process, and peeling process can all be performed with reference to the method in the dry film use.

In the exposure process, examples of the exposure can include a mask exposure method (a method in which the negative or positive mask pattern of the wiring pattern emits the active light in an image form), and a projection exposure method. A direct drawing exposure method in which the active light is irradiated in an image form (such as the direct imaging exposure method by laser and the digital optical processing exposure method) can also be used. As the light source of active light, well-known light sources can be used, for example light sources effectively emitting ultraviolet rays such as carbon arc lamp, mercury vapor arc lamp, ultra-high pressure indicator lamp, high pressure indicator lamp, xenon lamp, gas laser such as argon laser, solid laser such as YAG laser, semiconductor laser, and gallium nitride-based blue-violet laser. In addition, light sources effectively emitting visible light, such as floodlight for photography and fluorescent lamp, can also be used. For the photosensitive resin composition of the present invention, the type of light source of active light is not particularly limited, and the exposure amount is preferably 10-1000 mJ/cm$^2$.

In the development process, the unexposed portion of the photosensitive resin layer is removed by a developer. When there is a support on the photosensitive resin layer, the support can be first removed using an automatic stripper or the like, and then the unexposed portion can be removed using a developer such as an alkaline aqueous solution, an aqueous developer, or an organic solvent. Examples of the alkaline aqueous solution may be 0.1-5% by mass sodium carbonate solution, 0.1-5% by mass potassium carbonate solution, 0.1-5% by mass sodium hydroxide solution, etc. The pH value is preferably 9-11. Surfactants, defoamers, organic solvents, and the like can also be added to the alkaline aqueous solution. The development method can be conventional methods such as dipping, spraying, and brushing.

In the etching process, the resist pattern (i.e., protective pattern) formed on the substrate is used as a mask, to etch and remove the uncovered conductor layer of the substrate for circuit formation, thereby forming a conductor pattern. The method for the etching process can be selected according to the conductor layer to be removed. For example, examples of the etching solution may include a copper oxide solution, an iron oxide solution, an alkali etching solution, and a hydrogen peroxide-based etching solution.

In the plating process, the resist pattern formed on the substrate is used as a mask, to plate copper, solder, and the like on the uncovered insulating sheet of the substrate for circuit formation. After the plating process, the resist pattern is removed to form a conductor pattern. The method used in the plating process may be the electroplating treatment or electroless plating treatment, and the electroless plating treatment is preferable. Examples of electroless plating treatment may include: copper plating such as copper sulfate plating and copper pyrophosphate plating, solder plating such as high-throw solder plating, nickel plating such as Watt bath (nickel sulfate-nickel chloride) plating and nickel sulfamate plating, and gold plating such as hard gold plating and soft gold plating.

The removal of the resist pattern can be an aqueous solution that is more alkaline than the alkaline aqueous solution used in the development process. As an example of a strong alkaline aqueous solution, for example, 1-10% by mass of sodium hydroxide aqueous solution can be used.

DESCRIPTION OF EMBODIMENTS

Hereinafter, the present invention will be further described in detail with reference to specific examples, but it should not be understood as a limitation to the protection scope of the present invention.

1. Preparation of EO/PO Modified 9-phenylacridine Photosensitizer 1.1 Preparation of Product C1

1.1.1 Preparation of Intermediate A

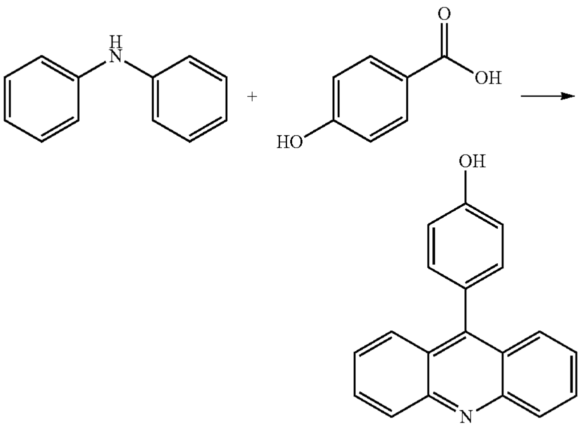

To a four-necked flask 244.8 g of diphenylamine, 399.6 g of p-hydroxybenzoic acid, 394.4 g of anhydrous zinc chloride, 192.0 g of 85% phosphoric acid, and 30.0 g of xylene were successively added. The electric heating was initiated to warm to an internal temperature of 195±5° C. The reaction was conducted under heat preservation, and the generated water was continuously discharged during the reaction process. The reaction process was under the central control by HPLC, and when the residual p-hydroxybenzoic acid was less than 1%, the heat preservation was terminated. After slowly dropwise adding 1200 g of 30% dilute sulfuric acid to the reaction system, it was cooled to 70~80° C. The lower acid water layer was separated, and the upper organic layer was adjusted to pH 10 with ammonia water, then cooled to 20~30° C., and subjected to suction filtration. The crude product was slurried with 1000 ml of methanol and 100 ml of toluene at 70° C. for 1 hour, subjected to suction filtration while hot, and dried, to obtain 240 g of Intermediate A with a purity of 99.12%.

LCMS was used to confirm the structure of Intermediate A. By means of the software accompanied with the instrument, 272 and 273 molecular fragment peaks were obtained in the mass spectrometry analysis. The molecular weight of the product is 271, consistent with T+1 and T+2.

1.1.2 Preparation of Intermediate B

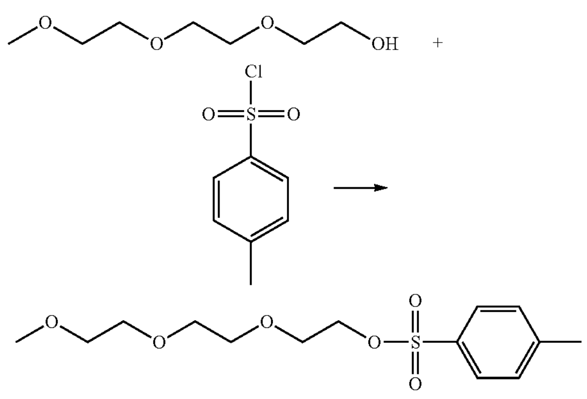

To a four-necked flask 56.1 g of p-toluenesulfonyl chloride, 50.0 g of triethylene glycol monomethyl ether, 200.0 g of dichloromethane, and 0.5 g of 4-dimethylaminopyridine were successively added. After warming to 30° C., 34 g of triethylamine was dropwise added over about 30 min. After the dropwise addition was completed, the reaction was conducted under heat preservation. The reaction process was under the central control by HPLC, and when the residual p-toluenesulfonyl chloride was less than 1%, the heat preservation was terminated. After the suction filtration of the reaction solution, the filtrate was washed three times with 100 g of pure water, dried with anhydrous sodium sulfate, filtered, and concentrated, to obtain 80.3 g of Intermediate B with a purity of 96.51%. It was directly used in the next reaction without further purification.

LCMS was used to confirm the structure of Intermediate B. By means of the software accompanied with the instrument, 319 and 320 molecular fragment peaks were obtained in the mass spectrometry analysis. The molecular weight of the product is 318, consistent with T+1 and T+2.

1.1.3 Preparation of Product C1

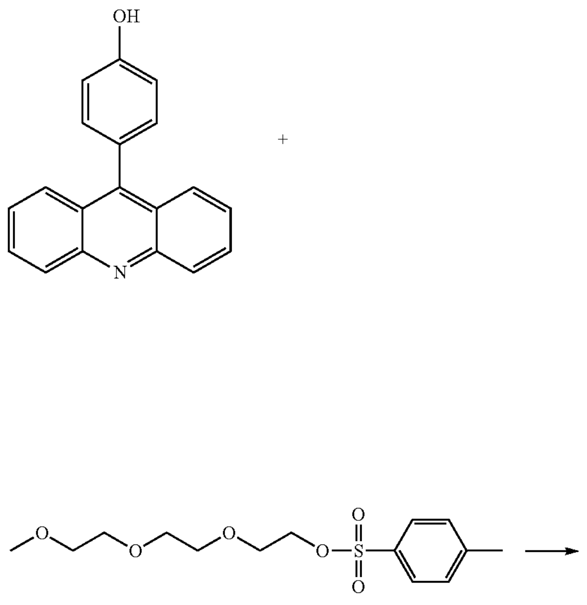

-continued

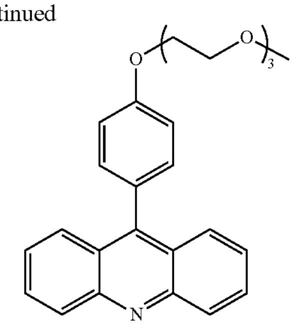

To a four-necked flask 60.0 g of Intermediate B, 250.0 g of DMF, 56.6 g of Intermediate A, and 43.7 g of potassium carbonate were successively added. The stirring was initiated and the temperature was warmed to 100° C., and the reaction was conducted under heat preservation. The reaction process was under the central control by HPLC, and when the residual Intermediate A was less than 1%, the heat preservation was terminated. After the suction filtration of the reaction solution, 200 g of DMF was distilled under reduced pressure from the filtrate and poured into 200 mL of water. A large amount of yellow solid was precipitated and subjected to suction filtration, and the filter cake was subjected to recrystallization with 100 mL of methanol, and dried to obtain Product C1 with a purity of 99.23%.

LCMS was used to confirm the structure of Product C1. By means of the software accompanied with the instrument, 418 and 419 molecular fragment peaks were obtained in the mass spectrometry analysis. The molecular weight of the product is 417, consistent with T+1 and T+2.

The structure of Product C1 was further confirmed by NMR, and the data are as follows:

$^1$H NMR (400 MHz, DMSO-d6) 8.22 (d, 2H), 7.86 (t, 2H), 7.70 (d, 2H), 7.55 (d, 2H), 7.41 (d, 2H), 7.24 (d, 2H), 4.26 (t, 2H), 3.85 (t, 2H), 3.67-3.39 (m, 8H), 3.26 (s, 3H) ppm.

1.2 Preparation of Product C2

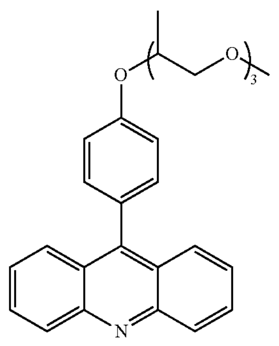

Referring to the synthesis method for Product C1, the raw material d, namely triethylene glycol monomethyl ether, was replaced with tripropylene glycol monomethyl ether, to obtain Product C2 with a purity of 99.15%.

LCMS was used to confirm the structure of Product C2. By means of the software accompanied with the instrument, 460 and 461 molecular fragment peaks were obtained in the mass spectrometry analysis. The molecular weight of the product is 459, consistent with T+1 and T+2.

The structure of Product C2 was further confirmed by NMR, and the data are as follows:

$^1$H NMR (400 MHz, DMSO-d6) 8.23 (d, 2H), 7.87 (t, 2H), 7.72 (d, 2H), 7.54 (d, 2H), 7.40 (d, 2H), 7.22 (d, 2H), 4.17-3.30 (m, 9H), 3.13 (s, 3H), 1.33 (d, 9H) ppm.

1.3 Preparation of Product C3

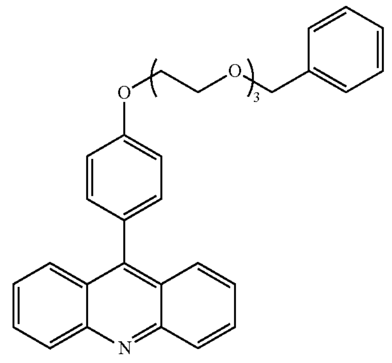

Referring to the synthesis method for Product C1, the raw material d, namely triethylene glycol monomethyl ether, was replaced with tripropylene glycol monobenzyl ether, to obtain Product C3 with a purity of 99.55%.

LCMS was used to confirm the structure of Product C3. By means of the software accompanied with the instrument, 494 and 495 molecular fragment peaks were obtained in the mass spectrometry analysis. The molecular weight of the product is 493, consistent with T+1 and T+2.

The structure of Product C3 was further confirmed by NMR, and the data are as follows:

$^1$H NMR (400 MHz, DMSO-d6) 8.25 (d, 2H), 7.87 (t, 2H), 7.72 (d, 2H), 7.59 (d, 2H), 7.46 (d, 2H), 7.35-7.33 (m, 5H), 7.24 (d, 2H), 4.83 (s, 2H), 4.30 (t, 2H), 3.80 (t, 2H), 3.57-3.33 (m, 8H) ppm.

1.4 Preparation of Product C4

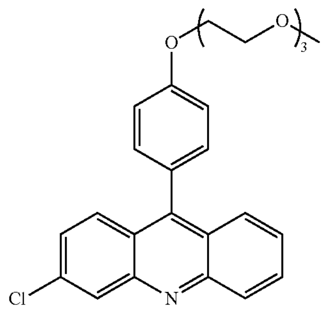

Referring to the synthesis method for Product C1, the raw material b, namely diphenylamine, was replaced with m-chlorodiphenylamine, to obtain Product C4 with a purity of 99.15%.

LCMS was used to confirm the structure of Product C4. By means of the software accompanied with the instrument, 452 and 453 molecular fragment peaks were obtained in the mass spectrometry analysis. The molecular weight of the product is 451, consistent with T+1 and T+2.

The structure of Product C4 was further confirmed by NMR, and the data are as follows:

$^1$H NMR (400 MHz, DMSO-d6) 8.26 (d, 1H), 8.11 (d, 1H), 8.06 (d, 1H), 8.01 (d, 1H), 7.70 (d, 2H), 7.57 (d, 1H), 7.36 (d, 1H), 7.27 (d, 1H), 7.05 (d, 2H), 4.29 (t, 2H), 3.88 (t, 2H), 3.68-3.39 (m, 8H), 3.29 (s, 3H) ppm.

1.5 Preparation of Product C5

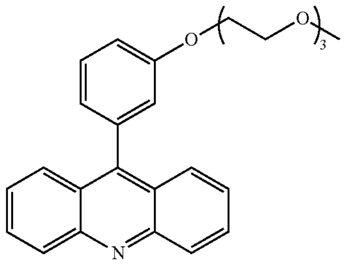

Referring to the synthesis method for Product C1, the raw material a, namely p-hydroxybenzoic acid, was replaced with m-hydroxybenzoic acid, to obtain Product C5 with a purity of 99.15%.

LCMS was used to confirm the structure of Product C5. By means of the software accompanied with the instrument, 460 and 461 molecular fragment peaks were obtained in the mass spectrometry analysis. The molecular weight of the product is 459, consistent with T+1 and T+2.

The structure of Product C5 was further confirmed by NMR, and the data are as follows:

$^1$H NMR (400 MHz, DMSO-d6) 8.24 (d, 2H), 7.83 (t, 2H), 7.71 (d, 2H), 7.54 (d, 2H), 7.44 (s, 1H), 7.40 (d, 1H), 7.33 (t, 1H), 7.25 (d, 1H), 4.21-3.33 (m, 9H), 3.16 (s, 3H), 1.31 (d, 9H) ppm.

1.6 Preparation of Product C6

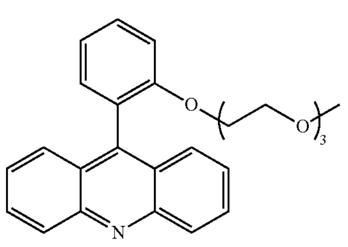

Referring to the synthesis method for Product C1, the raw material a, namely p-hydroxybenzoic acid, was replaced with o-hydroxybenzoic acid, to obtain Product C6 with a purity of 99.25%.

LCMS was used to confirm the structure of Product C5. By means of the software accompanied with the instrument, 460 and 461 molecular fragment peaks were obtained in the mass spectrometry analysis. The molecular weight of the product is 459, consistent with T+1 and T+2.

The structure of Product C6 was further confirmed by NMR, and the data are as follows:

$^1$H NMR (400 MHz, DMSO-d6) 8.23 (d, 2H), 7.83 (t, 2H), 7.72 (d, 2H), 7.53 (d, 2H), 7.48 (d, 1H), 7.40 (d, 1H), 7.32 (t, 1H), 7.25 (d, 1H), 4.22-3.35 (m, 9H), 3.16 (s, 3H), 1.31 (d, 9H) ppm.

2. Photosensitizer Solubility Test

The solubility performances of the above products $C_1$-$C_6$ were tested, using 2-butanone and PGMEA as solvent represents. Among them, 9-phenylacridine (denoted as C7, produced by CHANGZHOU TRONLY NEW ELECTRONIC MATERIALS CO., LTD.) was used for comparison. The test results are shown in Table 1.

TABLE 1

| No. | Test temperature | Solubility in 2-butanone (g) | Solubility in PGMEA (g) |
|---|---|---|---|
| C1 | 25° C. | 21.10 | 13.53 |
| C2 | 25° C. | 28.43 | 15.78 |
| C3 | 25° C. | 19.87 | 11.65 |
| C4 | 25° C. | 20.88 | 13.25 |
| C5 | 25° C. | 22.19 | 13.74 |
| C6 | 25° C. | 21.39 | 13.54 |
| C7 | 25° C. | 0.74 | 0.51 |

It can be seen from the solubility data in Table 1 that the EO/PO modified 9-phenylacridine photosensitizer of the present invention has significantly better solubility than 9-phenylacridine.

3. Preparation of Photosensitive Resin Composition

According to the formulation shown in Table 2, the components were uniformly mixed to prepare the photosensitive resin compositions. Unless otherwise specified, the parts shown in Table 2 are all parts by mass.

TABLE 2

| | Example | | | | | | Comparative Example |
|---|---|---|---|---|---|---|---|
| No. | 1 | 2 | 3 | 4 | 5 | 6 | 1 |
| C1 | 0.4 | | | | | | |
| C2 | | 0.4 | | | | | |
| C3 | | | 0.4 | | | | |
| C4 | | | | 0.4 | | | |
| C5 | | | | | 0.4 | | |
| C6 | | | | | | 0.4 | |
| C7 | | | | | | | 0.4 |
| A1 | 41 | 41 | 41 | 41 | 41 | 41 | 41 |
| A2 | 100 | 100 | 100 | 100 | 100 | 100 | 100 |
| B1 | 14 | 14 | 14 | 14 | 14 | 14 | 14 |
| B2 | 20 | 20 | 20 | 20 | 20 | 20 | 20 |
| B3 | 5 | 5 | 5 | 5 | 5 | 5 | 5 |
| B4 | 5 | 5 | 5 | 5 | 5 | 5 | 5 |

TABLE 2-continued

| | Example | | | | | | Comparative Example |
|---|---|---|---|---|---|---|---|
| No. | 1 | 2 | 3 | 4 | 5 | 6 | 1 |
| D | 4 | 4 | 4 | 4 | 4 | 4 | 4 |
| E1 | 0.04 | 0.04 | 0.04 | 0.04 | 0.04 | 0.04 | 0.04 |
| E2 | 0.5 | 0.5 | 0.5 | 0.5 | 0.5 | 0.5 | 0.5 |
| E3 | 0.4 | 0.4 | 0.4 | 0.4 | 0.4 | 0.4 | 0.4 |

The meanings of the symbols for respective components in Table 2 are shown in Table 3.

TABLE 3

| Ingredient | No. | Specific component |
|---|---|---|
| Alkali-soluble polymer | A1 | Acrylic copolymer, in butanone solution, the copolymer accounting for 30 parts by mass, having a composition of methyl methacrylate/methacrylic acid/n-butyl acrylate (mass ratio 70/20/10), an acid equivalent of 334, and a weight-average molecular weight of 120,000 (CHANGZHOU TRONLY NEW ELECTRONIC MATERIALS CO., LTD.) |
| | A2 | Acrylic copolymer, in butanone solution, the copolymer accounting for 43 parts by mass, having a composition of methyl methacrylate/methacrylic acid/n-butyl acrylate (mass ratio 50/30/20), an acid equivalent of 340, and a weight-average molecular weight of 50,000 (CHANGZHOU TRONLY NEW ELECTRONIC MATERIALS CO., LTD.) |
| Compound having an ethylenically unsaturated double bond | B1 | Urethane compound of hexamethylene diisocyanate and pentapropylene glycol monomethacrylate (Shin-nakamura Chemical Co. Ltd.) |
| | B2 | Dipentaerythritol hexaacrylate (Shin-nakamura Chemical Co. Ltd.) |
| | B3 | Tetra-nonylphenylheptaethylene glycol dipropylene glycol acrylate (Asahi Kasei Co., Ltd.) |
| | B4 | Triacrylate with an average of 3 moles of cyclohexane added to p-trimethylolpropane (Hitachi Chemical Co., Ltd.) |
| Photoacid generator | D | Tribromomethylphenylsulfone (CHANGZHOU TRONLY NEW ELECTRONIC MATERIALS CO., LTD.) |
| Auxiliary agent | E1 | Malachite green (Hangzhou Hairui Chemical Co., Ltd.) |
| | E2 | Leuco Crystal Violet (Hangzhou Hairui Chemical Co., Ltd.) |
| | E3 | 4,4-Bis(diethylamino)benzophenone (CHANGZHOU TRONLY NEW ELECTRONIC MATERIALS CO., LTD.) |

4. Performance Evaluation 4.1 Evaluation Method

<Production of Dry Film>

The photosensitive resin composition was thoroughly stirred, uniformly coated on the surface of 25 μm-thick polyethylene glycol terephthalate film as a support using a bar coater, and dried in a dryer at 95° C. for 5 minutes, to form a 40 μm-thick photosensitive resin layer. Then, a 15 μm-thick polyethylene film as a protective layer was adhered on the surface of the photosensitive resin layer on which the polyethylene glycol terephthalate film was not laminated, to obtain a dry film.

<Substrate Surface Leveling>

As the substrate, a 1.2 mm-thick copper clad laminate laminated with a 35 μm-thick rolled copper foil was used, and the surface was subjected to wet polishing roll grinding (Scotch-Brite (registered trademark) HD #600 manufactured by 3M, passed twice).

<Laminating>

The polyethylene film protective layer was peeled off from the dry film, and then laminated on a copper clad laminate preheated to 60° C. at a roll temperature of 105° C. using a hot roll laminator (AL-70 from Asahi Kasei Co., Ltd.). The gas pressure was 0.35 MPa, and the laminating speed was 1.5 m/min.

<Exposure>

The mask was placed on a polyethylene glycol terephthalate film as the support, and the photosensitive layer was exposed using an ultra-high pressure mercury lamp (HMW-201KB manufactured by ORCMANUFACTURINGCO., LTD.) with an irradiation energy of 60 $mJ/cm^2$.

<Development>

The polyethylene glycol terephthalate film was peeled off. Using an alkali developer (a developer for dry film manufactured by FujiKiko Co., Ltd.), a 1% by mass $Na_2CO_3$ aqueous solution at 30° C. was sprayed on the photosensitive resin layer. The unexposed portion of the photosensitive resin layer was dissolved and removed over a period twice as long as the minimum development time. The shortest time required to completely dissolve the photosensitive resin layer in the unexposed portion was the minimum development time.

4.2 Evaluation Contents (1) Photosensitivity Evaluation

The laminated substrate was exposed for 15 minutes, using a 21-grade stepwise exposure table manufactured by Stouffer with 21-grade brightness changes from transparent to black, to evaluate the photosensitivity thereof. After exposure, it was developed over a period twice as long as the minimum development time, according to the exposure level where the grade in the stepwise exposure table is 8 in case of the completely residual resist film. It was graded as follows:

○: The exposure level was 20 $mJ/cm^2$ or less;

◎: The exposure level was 20 $mJ/cm^2$-50 $mJ/cm^2$ (excluding endpoints);

●: The exposure level was 50 $mJ/cm^2$ or more.

(2) Resolution Evaluation

Through line pattern mask with a width ratio of 1:1 between the exposed and unexposed portions, the laminated substrate was exposed for 15 minutes, and developed over a period twice as long as the minimum development time. The minimum mask line width for normally forming the cured resist line served as the resolution value, and it was graded as follows:

○: The resolution value was 30 μm or less;

◎: The resolution value was 30 μm-50 μm, (excluding endpoints);

●: The resolution value was 50 μm or more.

(3) Developing Property Evaluation

The photosensitive layer (resist layer) having a thickness of 40 μm and an area of 0.16 $m^2$ in the photosensitive resin laminate was dissolved in 200 ml of 1 mass % $Na_2CO_3$ aqueous solution, and sprayed for 3 hours under a spraying pressure of 0.1 MPa using a circulating sprayer. Then, the developer was left to stand for 1 day, to observe the appearance of aggregates. If the aggregates were appeared in large quantities, powdery or oily substances may be observed on the bottom or sides of the sprayer. In addition, sometimes the aggregates may float in the developer. For the composition with good developer aggregation property, these aggregates do not appear at all, or even if they do appear, they can be easily washed out from the sprayer by washing with a very small amount of water. By visual observation of the appearance of aggregates, it was graded as follows:

○: There were no aggregates on the bottom or sides of the sprayer, and a very small amount of aggregates floating in the developer that can be visually confirmed can be observed, but can be easily washed off when washing with water;

◎: There were aggregates on part of the bottom or sides of the sprayer and floating in the developer, which cannot be completely washed off even if washed with water;

●: The aggregates were visible in the entire sprayer and floating in the developer, which cannot be completely washed off and most of which were remained, even if washed with water.

(4) Dispersion Stability Evaluation

The photosensitive resin composition having the composition shown in Table 2 was thoroughly stirred, mixed, and uniformly coated on the surface of 19 μm-thick polyethylene glycol terephthalate film as a support using a bar coater. It was dried in a dryer at 95° C. for 4 min, to form a photosensitive resin layer, and stored in dark place at 20° C. for 2 weeks. Thereafter, the coated surface was visually inspected and graded as follows:

○: The coated surface was uniform;

●: Undissolved matters were separated out on the coated surface.

4.3 Evaluation Results

The evaluation results are shown in Table 4.

TABLE 4

| | Photo-sensitivity | Resolution | Develop-ability | Dispersion stability |
|---|---|---|---|---|
| Example 1 | 14/○ | 28/○ | ○ | ○ |
| Example 2 | 18/○ | 29/○ | ○ | ○ |
| Example 3 | 16/○ | 25/○ | ○ | ○ |
| Example 4 | 15/○ | 27/○ | ○ | ○ |
| Example 5 | 17/○ | 26/○ | ○ | ○ |
| Example 6 | 17/○ | 25/○ | ○ | ○ |
| Comparative Example 1 | 30/◎ | 43/◎ | ● | ● |

When the above-mentioned EO/PO modified 9-phenylacridine photosensitizer of the present invention is applied in the photosensitive resin composition, the composition has characteristics such as high photosensitivity, high resolution, high solubility, excellent dispersion stability, and excellent developing property, as well as better hydrophilicity during development, and can significantly reduce the amount of sludges in the recycled developer, so that the developer can be repeated for many times and effectively used. The photosensitive resin composition can be widely applied in the manufacture of printed circuit boards, protective patterns, conductor patterns, lead frames, semiconductor packages, and the like in a manner of dry and wet films.

The above-mentioned examples are preferred embodiments of the present invention, but the embodiments of the present invention are not limited by the above-mentioned examples. Any other changes, modifications, substitutions, combinations, and simplifications made without departing from the spirit and principle of the present invention should be equivalent replacement manners, and should be included in the protection scope of the present invention.

What is claimed is:

1. A photosensitive resin composition, comprising the following components:

(A) an alkali-soluble polymer;

(B) a compound having an ethylenically unsaturated double bond;

(C) the EO/PO modified 9-phenylacridine photosensitizer;

(D) a photoacid generator, having the structure as shown in the general formula (II):

(II)
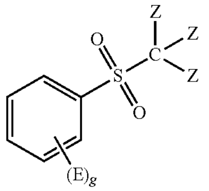
wherein, E is halogen, aryl, heterocyclyl, $C_1$-$C_6$ linear or branched alkyl, or $NR'_2$, R' being hydrogen or $C_1$-$C_6$ linear or branched alkyl; g is an integer from 0 to 5; and Z is halogen; and
(E) other optional auxiliary agents,
wherein the EO/PO modified 9-phenylacridine photosensitizer is selected from the group consisting of:
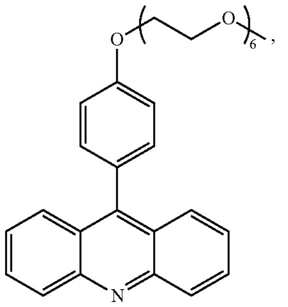
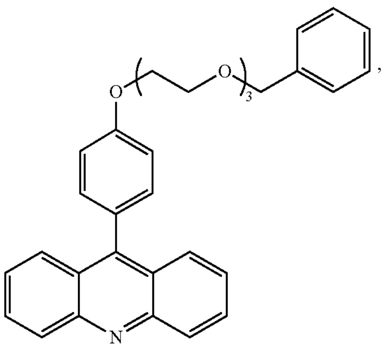
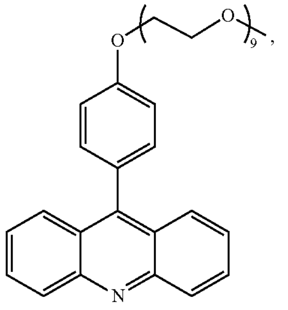
-continued
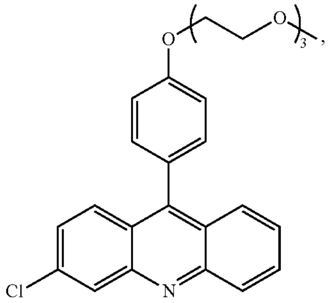
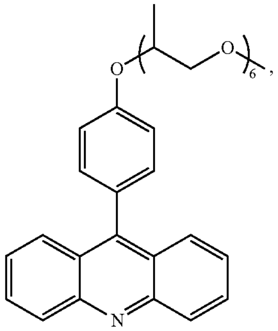
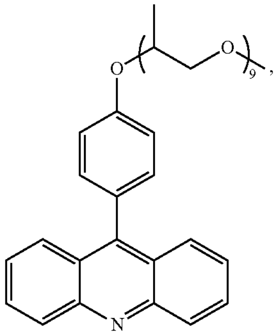
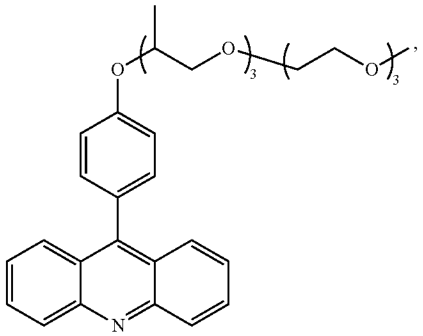
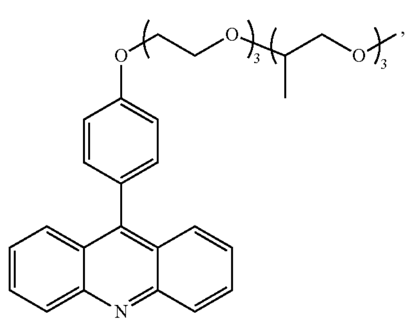

-continued

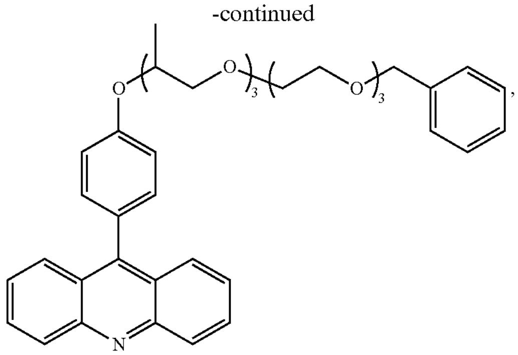,

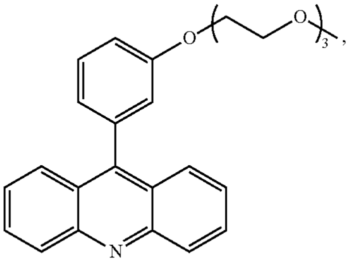,

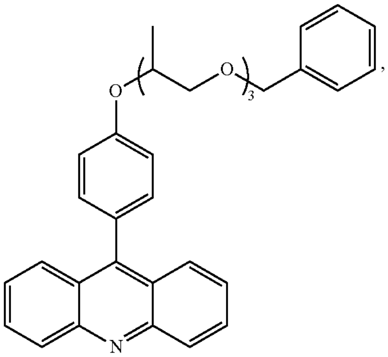,

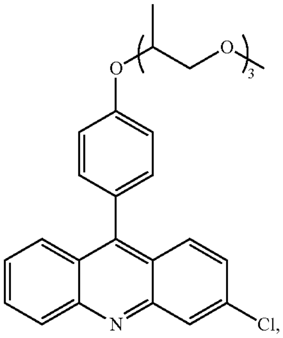,

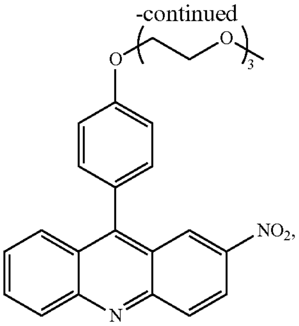, and

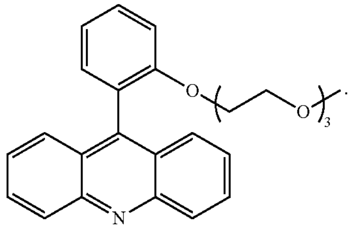.

2. The photosensitive resin composition according to claim 1, wherein E is halogen, $C_1$-$C_6$ linear or branched alkyl, or $NR'_2$, R' being hydrogen or $C_1$-$C_6$ linear or branched alkyl.

3. The photosensitive resin composition according to claim 1, wherein g is 0 or 1.

4. The photosensitive resin composition according to claim 2, wherein the photoacid generator is at least one selected from the group consisting of tribromomethylphenylsulfone, trichloromethylphenylsulfone, tribromomethyl-(4-methylphenyl) sulfone, tribromomethyl-(4-bromophenyl) sulfone, and tribromomethyl-(4-chlorophenyl) sulfone.

5. The photosensitive resin composition according to claim 1, wherein in 100 parts by mass of the photosensitive resin composition, the content of the alkali-soluble polymer in the composition is 20-70 parts by mass; the content of the compound having an ethylenically unsaturated double bond is 20-50 parts by mass; the content of the EO/PO modified 9-phenylacridine photosensitizer is 1-20 parts by mass; and the content of the photoacid generator is 0.01-10 parts by mass.

6. A photosensitive resin laminate, comprising: a photosensitive resin layer formed by the photosensitive resin composition according to claim 1, and a support that supports the photosensitive resin layer.

* * * * *